(12) United States Patent
Kim et al.

(10) Patent No.: US 8,796,127 B2
(45) Date of Patent: Aug. 5, 2014

(54) METHODS OF FABRICATING SEMICONDUCTOR DEVICES AND SEMICONDUCTOR DEVICES FORMED THEREBY

(71) Applicant: Samsung Electronics Co., Ltd., Suwon-si (KR)

(72) Inventors: Jaeseok Kim, Seoul (KR); Hoyoung Kim, Seongnam-si (KR); Bo Kyeong Kang, Seoul (KR); Sukhoon Jeong, Suwon-si (KR); Boun Yoon, Seoul (KR); Chang-Sun Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 22 days.

(21) Appl. No.: 13/734,306

(22) Filed: Jan. 4, 2013

(65) Prior Publication Data
US 2013/0237045 A1 Sep. 12, 2013

(30) Foreign Application Priority Data
Mar. 8, 2012 (KR) .................. 10-2012-0023951

(51) Int. Cl.
*H01L 21/28* (2006.01)
(52) U.S. Cl.
USPC .......................................... 438/589; 438/595
(58) Field of Classification Search
USPC .......................................... 438/589, 595, 926
See application file for complete search history.

(56) References Cited

U.S. PATENT DOCUMENTS

| | | | |
|---|---|---|---|
| 7,709,927 B2 | 5/2010 | Shin et al. | |
| 7,923,321 B2 | 4/2011 | Lai et al. | |
| 2004/0209458 A1 | 10/2004 | Tsai et al. | |
| 2007/0101658 A1 | 5/2007 | Heyer | |
| 2008/0290446 A1 | 11/2008 | Shin et al. | |
| 2011/0207285 A1 | 8/2011 | Kim et al. | |
| 2011/0233683 A1 | 9/2011 | Chuang et al. | |
| 2012/0122283 A1* | 5/2012 | Lee et al. | 438/287 |
| 2012/0171854 A1* | 7/2012 | He et al. | 438/591 |
| 2012/0309158 A1* | 12/2012 | Hung et al. | 438/301 |
| 2013/0043518 A1* | 2/2013 | Na et al. | 257/288 |
| 2013/0078791 A1* | 3/2013 | Xie et al. | 438/586 |
| 2013/0130460 A1* | 5/2013 | Liao et al. | 438/299 |
| 2013/0244416 A1* | 9/2013 | NG et al. | 438/595 |
| 2014/0027857 A1* | 1/2014 | Yin et al. | 257/368 |
| 2014/0042491 A1* | 2/2014 | Chen et al. | 257/190 |

FOREIGN PATENT DOCUMENTS

| | | |
|---|---|---|
| KR | 1020050032139 | 4/2005 |
| KR | 100843246 | 6/2008 |
| KR | 1020110095694 | 8/2011 |

\* cited by examiner

*Primary Examiner* — Alexander Ghyka
(74) *Attorney, Agent, or Firm* — Onello & Mello, LLP

(57) ABSTRACT

A method of fabricating a semiconductor device comprises: forming an etch stop layer to cover sidewall and top surfaces of first and second dummy gate patterns on a substrate; and forming an interlayer insulating layer on the substrate and the etch stop layer. The interlayer insulating layer is planarized to expose the etch stop layer on the first and second dummy gate patterns, and the etch stop layer is etched to expose the top surfaces and upper sidewall surfaces of the first and second dummy gate patterns, thereby forming a groove between the interlayer insulating layer and the first and second dummy gate patterns. The dummy gate patterns are removed, and gate electrodes are formed in their places.

14 Claims, 8 Drawing Sheets

METHODS OF FABRICATING SEMICONDUCTOR DEVICES AND SEMICONDUCTOR DEVICES FORMED THEREBY

CROSS-REFERENCE TO RELATED APPLICATIONS

This U.S. non-provisional patent application claims priority under 35 U.S.C. §119 to Korean Patent Application No. 10-2012-0023951, filed on Mar. 8, 2012, in the Korean Intellectual Property Office, the entire contents of which are hereby incorporated by reference.

BACKGROUND

Embodiments of the inventive concepts relate to a method of fabricating a semiconductor device.

Semiconductor devices may be fabricated by a gate last process or a replacement metal gate (RMG) process. In such processes, a process of fabricating a semiconductor device may include forming a dummy gate pattern, removing the dummy gate pattern to form a trench, and forming a gate insulating layer and a gate electrode in the trench. These processes can lead to shorting of the resulting gate and nearby conductive interconnect structures under certain conditions.

SUMMARY

Embodiments of the inventive concepts provide a fabrication method that mitigates or eliminates the occurrence of an electrical connection, or shorting, between a contact plug and a transistor gate. Embodiments of the inventive concepts further improve reliability of the resulting semiconductor device.

In an aspect, a method of fabricating a semiconductor device comprises: forming first and second dummy gate patterns spaced apart from each other on a substrate; forming an etch stop layer to cover sidewall and top surfaces of the first and second dummy gate patterns; forming an interlayer insulating layer on the substrate and the etch stop layer; planarizing the interlayer insulating layer to expose the etch stop layer on the first and second dummy gate patterns; etching the etch stop layer to expose the top surfaces and upper sidewall surfaces of the first and second dummy gate patterns, thereby forming a groove between the interlayer insulating layer and the first and second dummy gate patterns; forming a gap-filling insulating pattern to fill the groove; removing the first and second dummy gate patterns to form first and second trenches exposing the substrate; forming a gate insulating layer on bottom surfaces of the first and second trenches; and forming first and second gate electrodes on the gate insulating layer.

In some embodiments, the method further comprises, before the forming of the first and second dummy gate patterns, forming a pad oxide on the substrate.

In some embodiments, the etch stop layer further covers the pad oxide, and the forming of the trench further comprises removing the pad oxide below the first and second dummy gate patterns.

In some embodiments, the gate insulating layer comprises a high-k material; and the gate electrode comprises at least one of titanium, titanium nitride, tantalum, tantalum nitride, tungsten, copper, aluminum, or a mixture thereof.

In some embodiments, the gap-filling insulating layer is formed by an atomic-layer deposition process and comprises at least one of a silicon oxide layer, a silicon nitride layer, or a silicon oxynitride layer.

In some embodiments, the gap-filling insulating layer is a silicon oxide layer formed by a flowable chemical vapor deposition process.

In some embodiments, the forming of the gap-filling insulating pattern comprises: forming a gap-filling insulating layer to fill the groove and to cover the first and second dummy gate pattern and the interlayer insulating layer; and planarizing the gap-filling insulating layer to expose top surfaces of the first and second dummy gate patterns.

In some embodiments, the planarizing of the gap-filling insulating layer is performed using an etch-back process or a chemical-mechanical polishing process.

In some embodiments, the method further comprises, before the forming of the gap-filling insulating layer, performing a planarization process to reduce a difference in height between top surfaces of the interlayer insulating layer and top surfaces of the first and second dummy gate patterns.

In some embodiments, the method further comprises, after the planarizing of the gap-filling insulating layer, performing a planarization process to reduce a difference in height between top surfaces of the interlayer insulating layer and the first and second dummy gate patterns.

In some embodiments, the removal of the first and second dummy gate patterns is performed after performing a planarization process for reducing a difference in height between top surfaces of the interlayer insulating layer and the first and second dummy gate patterns.

In another aspect, a method of fabricating a semiconductor device, comprises: providing a substrate formed with a pad oxide; forming first and second dummy gate patterns spaced apart from each other on the pad oxide; forming an etch stop layer to cover sidewall surfaces and top surfaces of the first and second dummy gate patterns; forming a first interlayer insulating layer on the pad oxide and the etch stop layer; planarizing the first interlayer insulating layer to expose the etch stop layer on the first and second dummy gate patterns; etching the etch stop layer to expose the top surfaces and upper sidewall surfaces of the first and second dummy gate patterns, thereby forming a groove between the first interlayer insulating layer and the first and second dummy gate patterns; forming a gap-filling insulating pattern to fill the groove; removing the first and second dummy gate patterns and the pad oxide provided thereunder to form first and second trenches exposing the substrate; forming a gate insulating layer on bottom surfaces of the first and second trenches; forming first and second gate electrodes on the gate insulating layer; forming a second interlayer insulating layer on the first and second gate electrodes, the first interlayer insulating layer, and the gap-filling insulating pattern; and forming a contact plug connected to the substrate between the first and second gate electrodes through the second interlayer insulating layer.

In some embodiments, the etch stop layer further covers the pad oxide.

In some embodiments, the forming of the gap-filling insulating pattern comprises: forming a gap-filling insulating layer to fill the groove and to cover the first and second dummy gate patterns and the first interlayer insulating layer; and planarizing the gap-filling insulating layer to expose top surfaces of the first and second dummy gate patterns.

In another aspect, a semiconductor device comprises: first and second gate electrodes spaced apart from each other on a substrate; a gate insulating layer between the substrate and the first and second gate electrodes; a first interlayer insulating layer between the first and second gate electrodes; an etch stop layer between the first and second gate electrodes and the first interlayer insulating layer and on lower portions of sidewalls of the first and second gate electrodes; a gap-filling insulating pattern on the etch stop layer and in contact with upper portions of the sidewalls of the first and second gate electrodes; a second interlayer insulating layer on the first and second gate electrodes, the gap-filling insulating pattern, and the first interlayer insulating layer; and a contact plug electrically connected to the substrate through the second and first interlayer insulating layers.

In some embodiments, the first and second gate electrodes, the first interlayer insulating layer, and the gap-filling insulating pattern have top surfaces coplanar with each other.

In another aspect, a semiconductor device comprises: a gate electrode on a substrate; a gate insulating layer between the substrate and the gate electrode; an interlayer insulating layer on the substrate at a sidewall of the gate electrode; a first insulating layer pattern between the interlayer insulating layer and the gate electrode at a lower portion of the sidewall of the gate electrode; and a second insulating layer pattern between the interlayer insulating layer and the gate electrode at an upper portion of the sidewall of the gate electrode, wherein a top surface of the gate electrode, a top surface of the interlayer insulating layer pattern and a top surface of the second insulating layer pattern are coplanar with each other.

In some embodiments, the first insulating layer pattern and the second insulating layer pattern comprise a same material.

In some embodiments, the first insulating layer pattern and the second insulating layer pattern comprise different materials.

In some embodiments, the semiconductor device further comprises a conductive contact plug in contact with the substrate through the interlayer insulating layer, wherein the second insulating layer pattern and the first insulating layer pattern are positioned between the contact plug and the gate electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
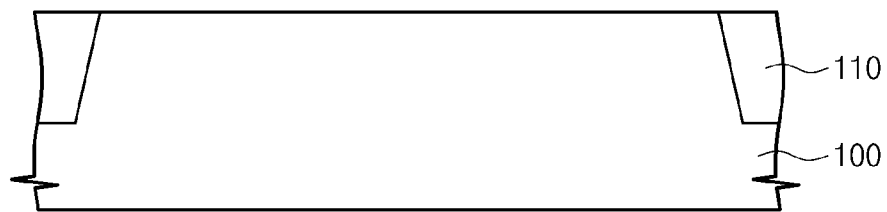
FIGS. 1 through 6, 7A through 7C, and 9 through 13 are sectional views illustrating a method of fabricating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Methods of fabricating a semiconductor device according to several embodiments of the inventive concept will be described with reference to FIGS. 1 through 15. FIGS. 1 through 6, 7A through 7C, and 9 through 13 are sectional views illustrating a method of fabricating a semiconductor device according to example embodiments of the inventive concept. In order to reduce complexity in the drawings and to provide better understanding of example embodiments of the inventive concept, some elements (such as, source/drain regions formed in a substrate) may be omitted.

Referring to FIG. 1, a substrate 100 is provided. In some example embodiments, the substrate 100 may comprise a silicon substrate (for example, a bulk silicon wafer or a silicon-on-insulator (SOI) wafer). In other example embodiments, the substrate 100 may comprise a material other than silicon. For example, the substrate 100 may include at least one of germanium, indium antimonide, lead telluride, indium arsenic, indium phosphide, gallium arsenic, gallium antimonide, or other suitable substrate material.

A device isolation layer 110 may be formed on the substrate 100. For example, the device isolation layer 110 may comprise a shallow trench isolation structure (STI) formed by a shallow-trench isolation process. Furthermore, the device isolation layer 110 may take the form of other suitable structures, and be formed according to other suitable techniques in consideration of recent technological progress in isolation layer processes.

Figure 2:
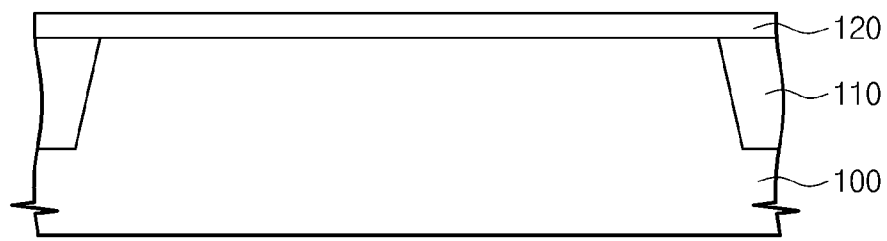

Referring to FIG. 2, a pad oxide 120 may be formed on the substrate 100. In various embodiments, the pad oxide 120 may be formed using one of dry oxidation, wet oxidation, or radical oxidation. For example, the pad oxide 120 may comprise a silicon oxide layer, which may be formed in accordance with a dry oxidation process, for example using oxygen ($O_2$) and hydrogen ($H_2$) gases.

Figure 3:
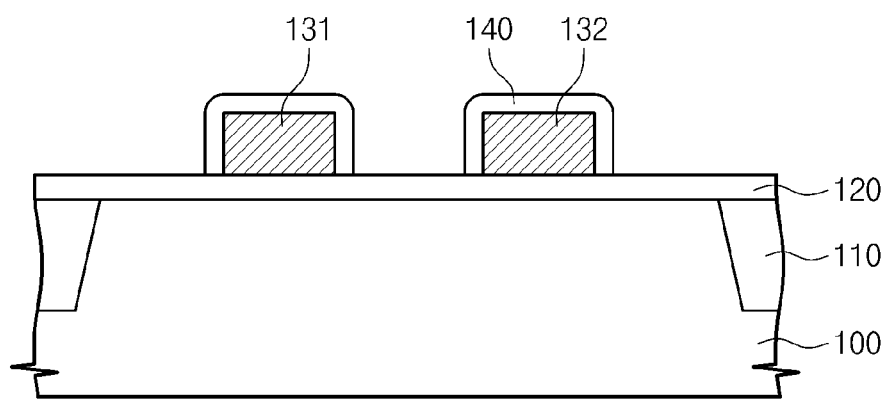

Referring to FIG. 3, first and second dummy gate patterns 131 and 132 may be formed on the pad oxide 120. An etch stop layer 140 may be formed on top and side surfaces of the first and second dummy gate patterns 131 and 132.

The first and second dummy gate patterns 131 and 132 may be formed of a semiconductor material (for example, polysilicon). The etch stop layer 140 may be a silicon nitride layer or a silicon oxynitride layer, or other suitable etch stop material. In example embodiments, the etch stop layer 140 may include a hard mask pattern (not shown) on the first and second dummy gate patterns 131 and 132 and a spacer (not shown) on sidewalls of the first and second dummy gate patterns 131 and 132. The hard mask pattern may be used as an etch mask during the process for forming the first and second dummy gate patterns 131 and 132. Source and drain regions (not shown) may be formed in portions of the substrate, which are not covered with the first and second dummy gate patterns 131 and 132.

Figure 4:
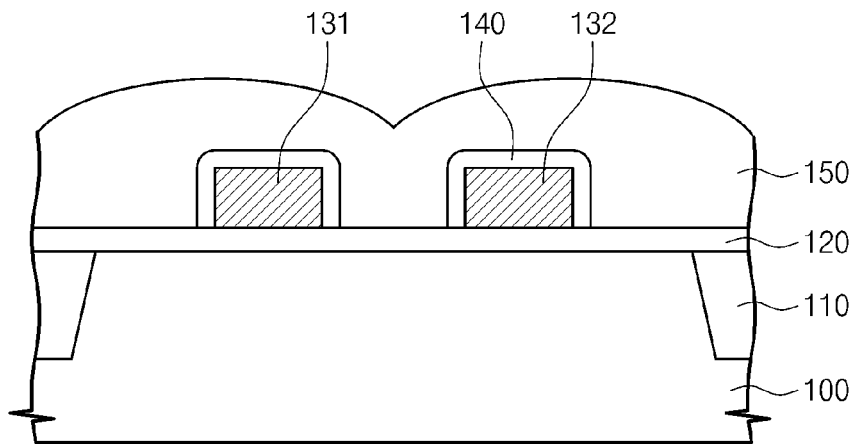
Figure 5:
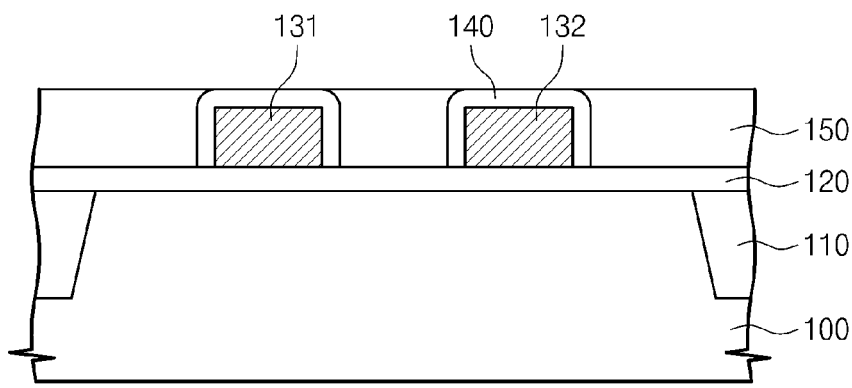

Referring to FIGS. 4 and 5, a first interlayer insulating layer 150 may be formed to cover the etch stop layer 140 and the pad oxide 120. The first interlayer insulating layer 150 may be a silicon oxide layer, which may be formed by a high density plasma (HDP) or flowable chemical vapor deposition (FCVD) process, or other suitable insulating layer. Thereafter, as shown in FIG. 5, the first interlayer insulating layer 150 may be planarized to expose a top surface of the etch stop layer 140 on the first and second dummy gate patterns 131 and 132. The planarization of the first interlayer insulating layer 150 may be performed using an etch-back process or a chemical-mechanical polishing (CMP) process, or other suitable process.

Figure 6:
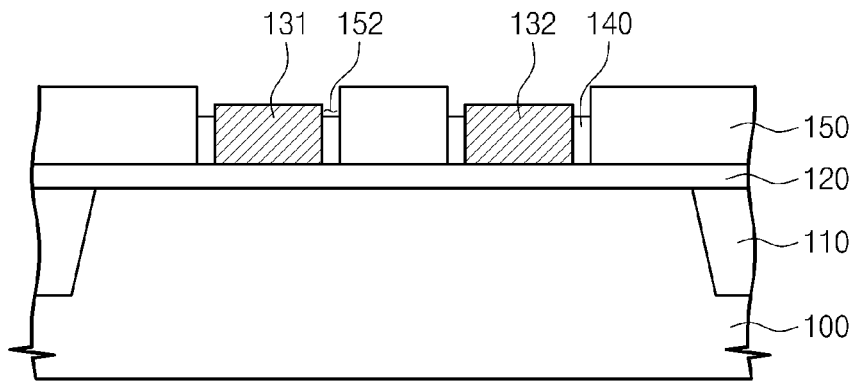

Referring to FIG. 6, the etch stop layer 140 may be partially removed to expose the top surfaces of the first and second dummy gate patterns 131 and 132. In example embodiments, the etch stop layer 140 may be partially etched to expose upper sidewalls of the first and second dummy gate patterns 131 and 132, in addition to the top surfaces thereof. Accordingly, grooves 152 may be formed between the first interlayer insulating layer 150 and the first and second dummy gate patterns 131 and 132 due to extended etching of the etch stop layer 140 at sidewalls of the dummy gate patterns 131, 132.

The partial removal of the etch stop layer 140 may be performed using one of a dry etching process or a wet etching process. In the case of the dry etching process, a compound gas containing carbon (C), hydrogen (H), and fluorine (F) (for example, $CH_3F$), or other suitable gas, may be used as an etching gas to etch the etch stop layer 140. In the case of the wet etching process, a solution containing phosphoric acid ($H_3PO_4$), or other suitable solution, may be used as an etching solution.

Figure 7A:
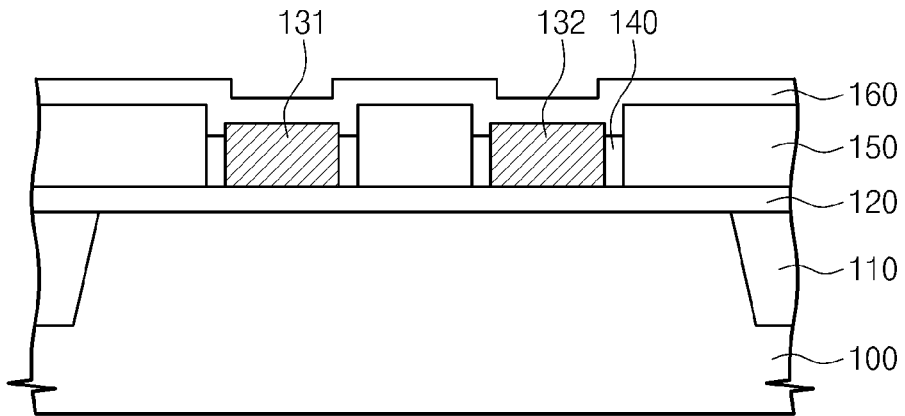

Referring to FIG. 7A, a gap-filling insulating layer 160 may be formed to fill the grooves 152 and cover the first interlayer insulating layer 150 and the first and second dummy gate patterns 131 and 132. The gap-filling insulating layer 160 may include one of a silicon oxide layer, a silicon nitride layer, or a silicon oxynitride layer or other suitable insulating layer. The gap-filling insulating layer 160 may be formed by one of an atomic layer deposition (ALD) process, a chemical vapor deposition (CVD) process, or the FCVD process. In the case of the ALD process, the gap-filling insulating layer 160 may be formed using a mixture gas containing carbon (C), hydrogen (H), nitrogen (N), or silicon (Si) (for example, BisTertiaryButylAminoSilane (BTBAS, $C_8H_{22}N_2Si$)) to have a thickness of about 60-300 Å. In the case of the FCVD process, the gap-filling insulating layer 160 may be formed using a mixture gas containing silicon (Si) and hydrogen (H) (for example, tri-silane (TSA, Si3H8) to have a thickness of about 200-600 Å.

Figure 7B:
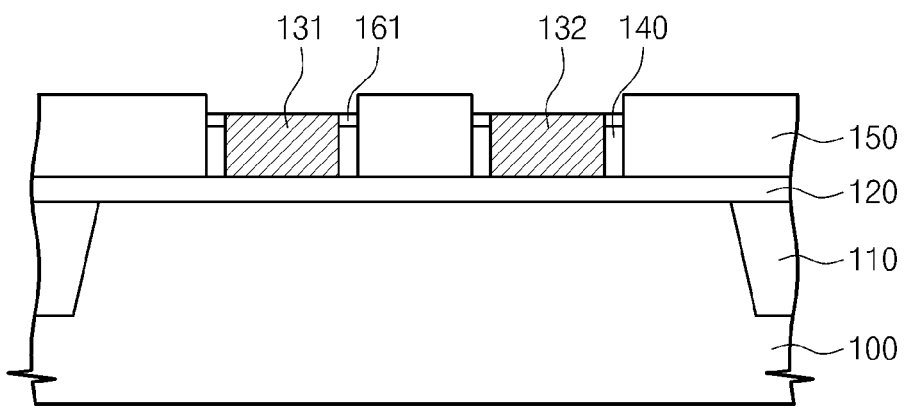
Figure 7C:
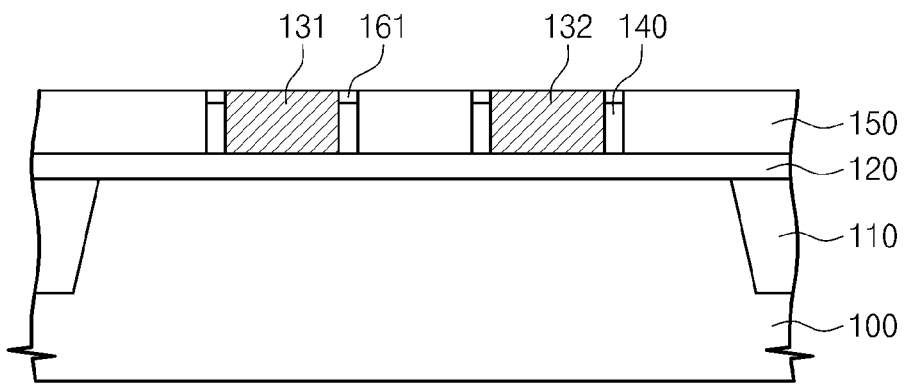

Referring to FIG. 7B, the gap-filling insulating layer 160 may be planarized to expose top surfaces of the first interlayer insulating layer 150 and the first and second dummy gate patterns 131 and 132. Accordingly, a gap-filling insulating pattern 161 may be formed to fill the grooves 152.

As a result of the above processes, there may be a difference in height between the top surfaces of the first and second dummy gate patterns 131 and 132 and the first interlayer insulating layer 150. In example embodiments, an additional planarization process may be performed to remove the height difference, as shown FIG. 7C. In this example embodiment, the additional planarization process removes material from a top surface of the interlayer insulating layer 150 to eliminate the height difference.

The planarization of the gap-filling insulating layer 160 may be performed using an etch-back process or a CMP process, or other suitable planarization process. For example, the etch-back process may be performed using a process gas containing ammonia (NH$_3$) gas and/or hydrogen fluoride (HF). In some embodiments, the CMP process may be performed using ceria-based slurries.

Figure 8A:
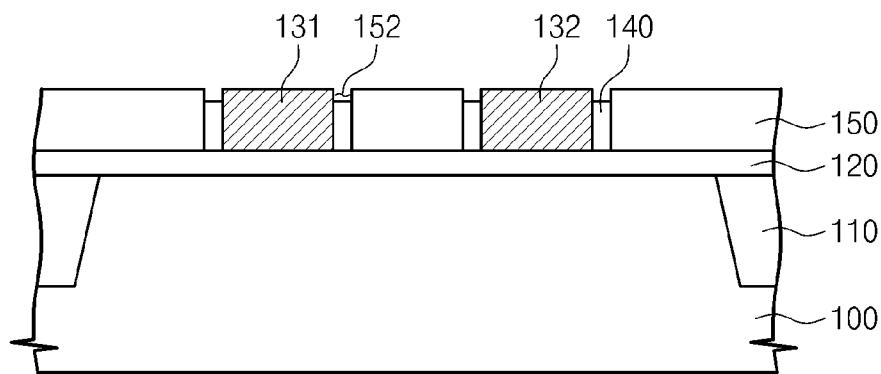
FIGS. 8A through 8C are sectional views illustrating a method of fabricating a semiconductor device according to other example embodiments of the inventive concepts.
Figure 8B:
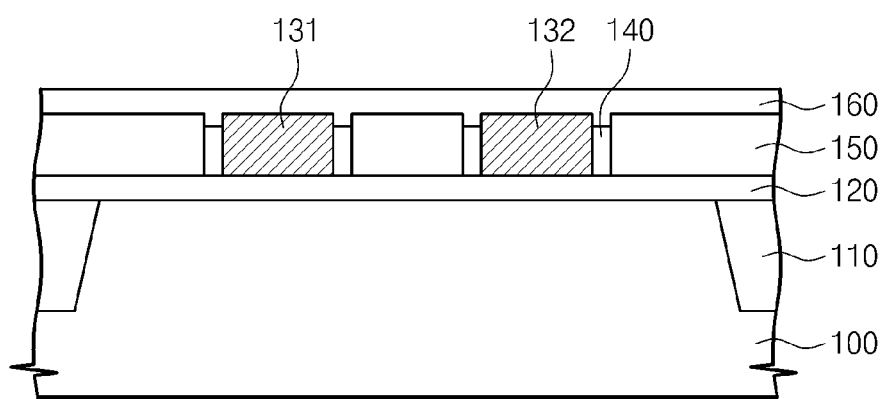
Figure 8C:
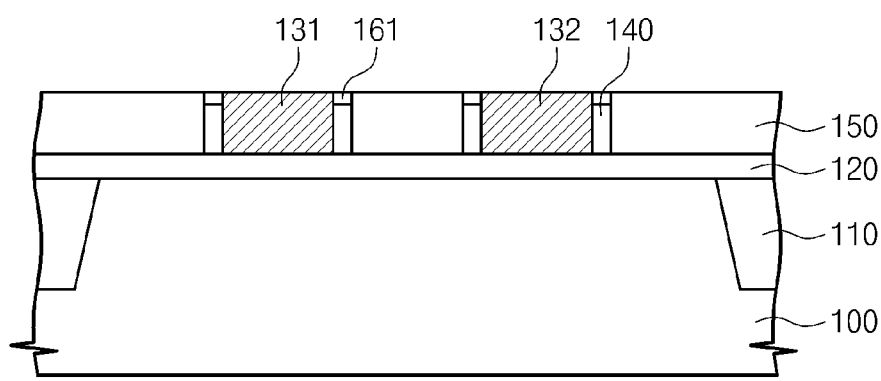

As will be described with reference to FIGS. 8A through 8C, the process described above in connection with FIGS. 7A through 7C for filling the grooves 152 shown in FIG. 6 may be performed through a different method. As shown in FIG. 6, the etch stop layer 140 may be etched to expose the top surfaces of the first and second dummy gate patterns 131 and 132. In example embodiments, as shown in FIG. 8A, the first and second dummy gate patterns 131 and 132 may be formed to have the top surfaces coplanar with top surfaces of the first interlayer insulating layer 150. This process may be performed by one of planarization techniques to planarize the first interlayer insulating layer 150. Referring to FIG. 8B, the gap-filling insulating layer 160 may be deposited on the resulting planarized first and second dummy gate patterns 131 and first interlayer insulating layer 150. Referring to FIG. 8B, the gap-filling insulating layer 160 can be planarized to form the gap-filling insulating pattern 161.

Figure 9:
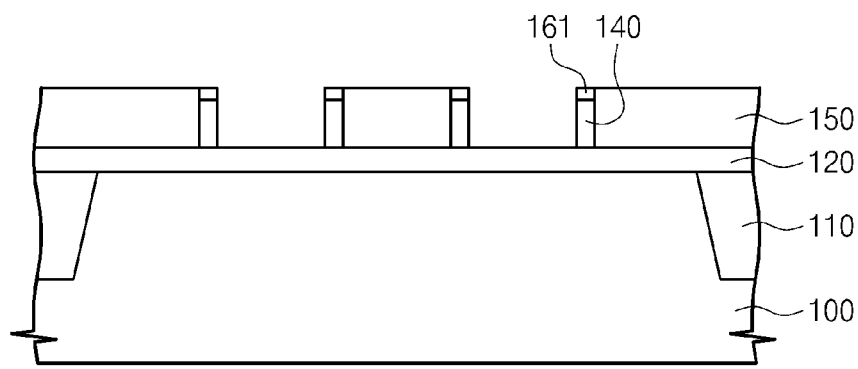
Figure 10:
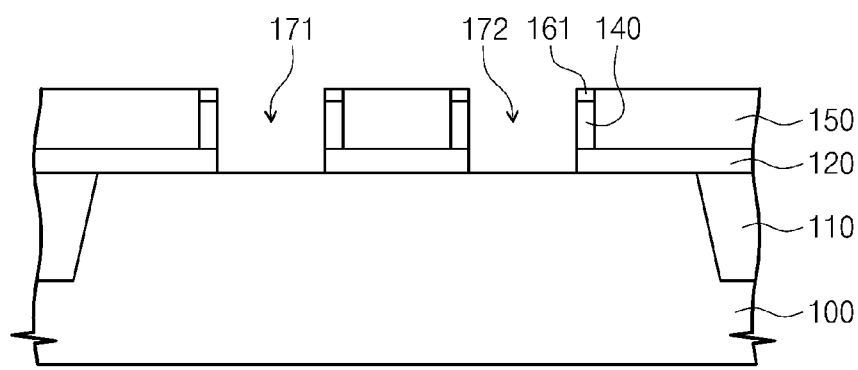

Referring to FIGS. 9 and 10, the first and second dummy gate patterns 131 and 132 may be selectively removed using an etch process that is selective relative to the gap-filling insulating pattern 161, the etch stop layer 140 and the first interlayer insulating layer 150. Next, the pad oxide layer 120 is selectively etched using the resulting structure as an etch mask. As a result, first and second trenches 171 and 172 are formed, the trenches exposing the substrate 100.

Figure 11:
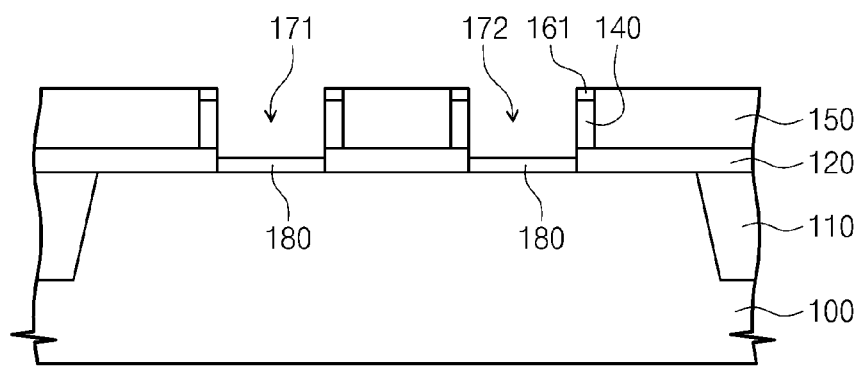

Referring to FIG. 11, a gate insulating layer 180 may be formed on portions of the substrate 100 exposed by the first and second trenches 171 and 172. In some example embodiments, the gate insulating layer 180 may be formed by an ALD process or a chemical oxidation process. In example embodiments, the gate insulating layer 180 may include at least one of high-k dielectric materials. For example, the gate insulating layer 180 may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Figure 12:
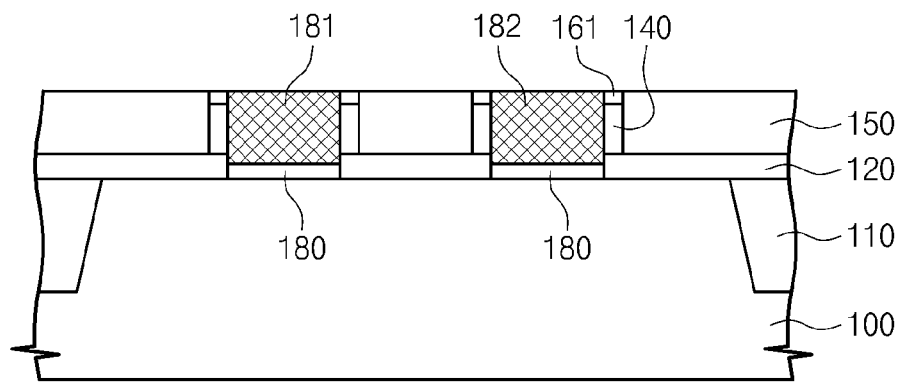

Referring to FIG. 12, first and second gate electrodes 181 and 182 may be formed on the gate insulating layer 180 in the first and second trenches 171 and 172, respectively. The formation of the first and second gate electrodes 181 and 182 may include forming a gate electrode layer on the gate insulating layer 180 and on the first interlayer insulating layer 150, and then planarizing the gate electrode layer to expose the top surface of the first interlayer insulating layer 150. In various embodiments, the planarization of the gate electrode layer may be used by an etch-back process or a CMP process, or by another suitable planarization process.

In various embodiments, the first and second gate electrodes 181 and 182 may include at least one of titanium, titanium nitride, tantalum, tantalum nitride, tungsten, copper, aluminum, or a mixture thereof. In various embodiments, the first and second gate electrodes 181 and 182 may include other suitable conductive metals, alloys thereof, mixtures thereof, or other suitable conductive metals.

Figure 13:
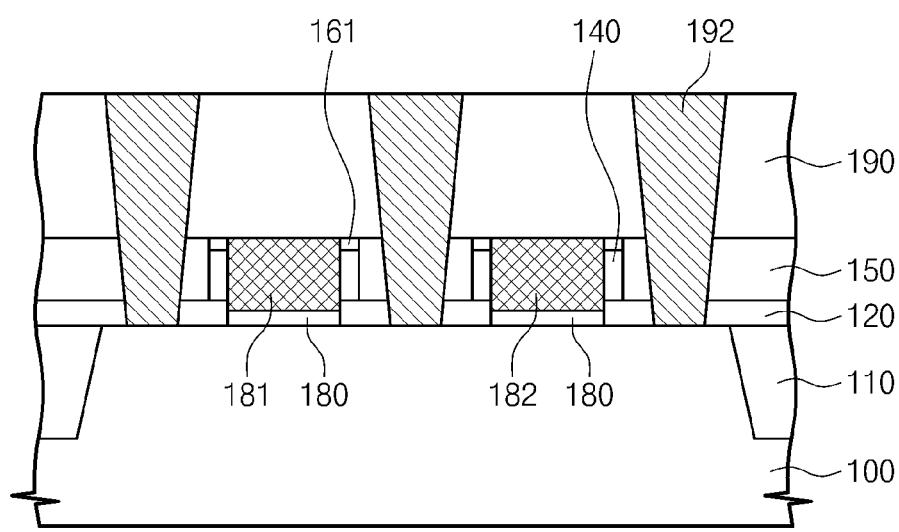

Referring to FIG. 13, a second interlayer insulating layer 190 may be formed on the first interlayer insulating layer 150 and on the first and second gate electrodes 181 and 182. A contact plug 192 may be formed in contact with the substrate 100 between and/or outside the first and second gate electrodes at positions that may correspond to the source and drain regions (not shown) of a resulting transistor structure. The contact plug 192 may be formed to penetrate the second and first interlayer insulating layers 190 and 150. The contact plug 192 may be formed to be in contact with the source or drain regions (not shown) of the substrate.

The method of fabricating a semiconductor device according to still other example embodiments of the inventive concepts will be described with reference to FIGS. 14 and 15, but for the sake of brevity, the elements and features of this example that are similar to those previously shown and described will not be described in much further detail again here.

Figure 14:
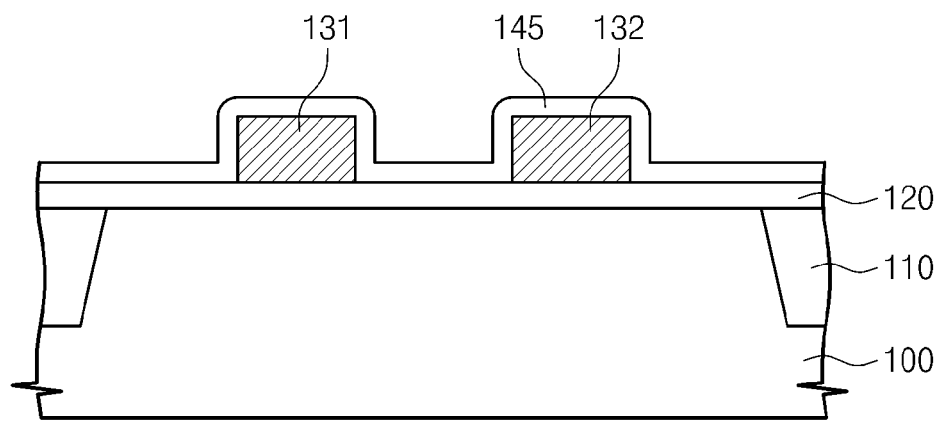
FIGS. 14 and 15 are sectional views illustrating a method of fabricating a semiconductor device according to still other example embodiments of the inventive concepts.

Referring to FIG. 14, following the step described herein in connection with FIG. 2, an etch stop layer 145 may be formed to cover a top surface of the pad oxide 120 provided on the substrate 100 as well as on the top and side surfaces of the first and second dummy gate patterns 131 and 132.

The etch stop layer 145 may comprise a silicon nitride layer or a silicon oxynitride layer, as described in the previous embodiments. In example embodiments, the etch stop layer 145 may include a hard mask pattern (not shown) on the first and second dummy gate patterns 131 and 132 and a spacer (not shown) on sidewalls of the first and second dummy gate patterns 131 and 132. Here, the hard mask pattern may be used as an etch mask during the process for forming the first and second dummy gate patterns 131 and 132.

Figure 15:
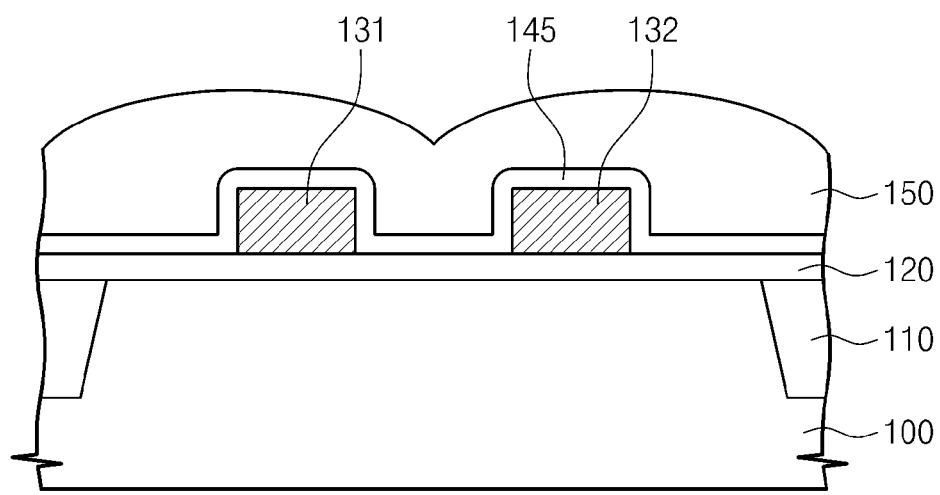

Referring to FIG. 15, the first interlayer insulating layer 150 may be formed on the etch stop layer 145, and the subsequent process may be performed in the same manner as that of the previous embodiments. In the present embodiment, the first interlayer insulating layer 150 is formed on the etch stop layer 145 prior to patterning of the etch stop layer 145, unlike the embodiment described herein in connection with FIGS. 3 and 4. Therefore, the entire etch stop layer 145 remains under the first interlayer insulating layer 150 until further processing of the device.

Figure 16:
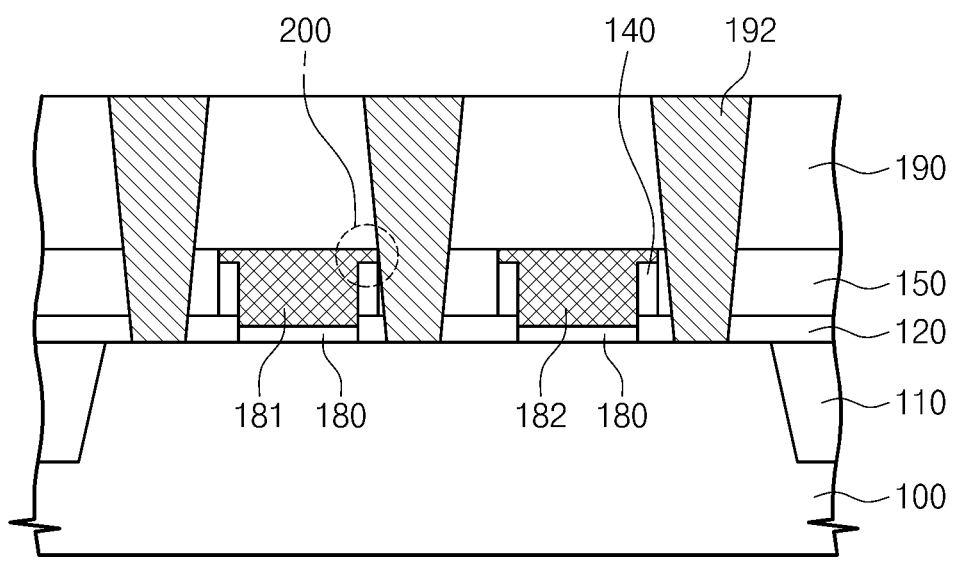
FIG. 16 is a sectional view of a semiconductor device according to a comparative example, to which the inventive concepts are not applied.

FIG. 16 is a sectional view of a semiconductor device according to a comparative example, to which the inventive concepts are not applied. In the case where a conductive material for the gate electrodes 181 and 182 is formed to fill the grooves 152 between the first interlayer insulating layer 150 and the first and second dummy gate patterns 131 and 132, which were previously described with reference to FIGS. 6 and 8A, the gate electrodes 181 and 182 may become electrically shorted to the contact plug 192, as depicted in dotted circle 200. This is especially true in cases where the contact plug 192 is misaligned with respect to the gate electrodes 181 and 182.

By contrast, according to example embodiments of the inventive concepts, the grooves 152 may be filled with the gap-filling insulating layer, rather than by conductive material of the contact plug Accordingly, the formation of the contact plug 192 can have sufficiently high process margin to prevent an electric short from occurring between the gate electrode 181 and 182 and the contact plug 192. In other words, even under conditions of a small misalignment of the contact plug 192 with respect to the gate electrodes 181 and 182, it is possible to prevent an electric short from occurring between the gate electrode 181 and 182 and the contact plug 192.

In a process of fabricating a transistor using a gate last process, an RMG process, or a similar process, a process of removing a dummy gate pattern may be performed to reduce a pattern failure, which may otherwise occur, for example at side regions of a trench, when the trench is formed in an interlayer insulating layer. This enables to prevent a gate electrode from becoming unintentionally connected to a neighboring contact plug. In such cases, the gate electrode is formed in the trench, and the contact plug is connected to a source or drain region. Accordingly, the formation of the contact plug can have sufficiently high process margin to prevent an electric short from occurring between the gate electrode and the contact plug, even in the case of a small misalignment of the contact plug with respect to the gate electrodes.

While example embodiments of the inventive concepts have been particularly shown and described, it will be understood by one of ordinary skill in the art that variations in form and detail may be made herein without departing from the spirit and scope of the attached claims.

What is claimed is:

1. A method of fabricating a semiconductor device, comprising:
    forming first and second dummy gate patterns spaced apart from each other on a substrate;
    forming an etch stop layer to cover sidewall and top surfaces of the first and second dummy gate patterns;
    forming an interlayer insulating layer on the substrate and the etch stop layer;
    planarizing the interlayer insulating layer to expose the etch stop layer on the first and second dummy gate patterns;
    etching the etch stop layer to expose the top surfaces and upper sidewall surfaces of the first and second dummy gate patterns, thereby forming a groove between the interlayer insulating layer and the first and second dummy gate patterns;
    forming a gap-filling insulating pattern to fill the groove;
    removing the first and second dummy gate patterns to form first and second trenches exposing the substrate;
    forming a gate insulating layer on bottom surfaces of the first and second trenches; and
    forming first and second gate electrodes on the gate insulating layer.

2. The method of claim 1, further comprising, before the forming of the first and second dummy gate patterns, forming a pad oxide on the substrate.

3. The method of claim 2, wherein the etch stop layer further covers the pad oxide, and wherein the forming of the trench further comprises removing the pad oxide below the first and second dummy gate patterns.

4. The method of claim 1, wherein the gate insulating layer comprises a high-k material; and
    wherein the gate electrode comprises at least one of titanium, titanium nitride, tantalum, tantalum nitride, tungsten, copper, aluminum, or a mixture thereof.

5. The method of claim 1, wherein the gap-filling insulating layer is formed by an atomic-layer deposition process and comprises at least one of a silicon oxide layer, a silicon nitride layer, or a silicon oxynitride layer.

6. The method of claim 1, wherein the gap-filling insulating layer is a silicon oxide layer formed by a flowable chemical vapor deposition process.

7. The method of claim 1, wherein the forming of the gap-filling insulating pattern comprises:
    forming a gap-filling insulating layer to fill the groove and to cover the first and second dummy gate pattern and the interlayer insulating layer; and
    planarizing the gap-filling insulating layer to expose top surfaces of the first and second dummy gate patterns.

8. The method of claim 7, wherein the planarizing of the gap-filling insulating layer is performed using an etch-back process or a chemical-mechanical polishing process.

9. The method of claim 7, further comprising, before the forming of the gap-filling insulating layer, performing a planarization process to reduce a difference in height between top surfaces of the interlayer insulating layer and top surfaces of the first and second dummy gate patterns.

10. The method of claim 7, further comprising, after the planarizing of the gap-filling insulating layer, performing a planarization process to reduce a difference in height between top surfaces of the interlayer insulating layer and the first and second dummy gate patterns.

11. The method of claim 1, wherein the removal of the first and second dummy gate patterns is performed after performing a planarization process for reducing a difference in height between top surfaces of the interlayer insulating layer and the first and second dummy gate patterns.

12. A method of fabricating a semiconductor device, comprising:
    providing a substrate formed with a pad oxide;
    forming first and second dummy gate patterns spaced apart from each other on the pad oxide;
    forming an etch stop layer to cover sidewall surfaces and top surfaces of the first and second dummy gate patterns;
    forming a first interlayer insulating layer on the pad oxide and the etch stop layer;
    planarizing the first interlayer insulating layer to expose the etch stop layer on the first and second dummy gate patterns;
    etching the etch stop layer to expose the top surfaces and upper sidewall surfaces of the first and second dummy gate patterns, thereby forming a groove between the first interlayer insulating layer and the first and second dummy gate patterns;
    forming a gap-filling insulating pattern to fill the groove;
    removing the first and second dummy gate patterns and the pad oxide provided thereunder to form first and second trenches exposing the substrate;
    forming a gate insulating layer on bottom surfaces of the first and second trenches;
    forming first and second gate electrodes on the gate insulating layer;
    forming a second interlayer insulating layer on the first and second gate electrodes, the first interlayer insulating layer, and the gap-filling insulating pattern; and
    forming a contact plug connected to the substrate between the first and second gate electrodes through the second interlayer insulating layer.

13. The method of claim 12, wherein the etch stop layer further covers the pad oxide.

14. The method of claim 12, wherein the forming of the gap-filling insulating pattern comprises:
   forming a gap-filling insulating layer to fill the groove and to cover the first and second dummy gate patterns and the first interlayer insulating layer; and
   planarizing the gap-filling insulating layer to expose top surfaces of the first and second dummy gate patterns.

\* \* \* \* \*